(12) United States Patent
Barina et al.

(10) Patent No.: US 7,675,754 B2
(45) Date of Patent: Mar. 9, 2010

(54) MECHANICALLY-ASSISTED INSERTION AND REMOVAL OF MODULAR DEVICE

(75) Inventors: Richard M. Barina, Sebring, FL (US);
Derek Ian Schmidt, Raleigh, NC (US);
James Scott Womble, Hillsborough, NC (US)

(73) Assignee: International Business Machines Corporation, Armonk, NY (US)

( * ) Notice: Subject to any disclaimer, the term of this patent is extended or adjusted under 35 U.S.C. 154(b) by 190 days.

(21) Appl. No.: 11/858,178

(22) Filed: Sep. 20, 2007

(65) Prior Publication Data

US 2009/0080165 A1 Mar. 26, 2009

(51) Int. Cl.
*H05K 7/00* (2006.01)

(52) U.S. Cl. ...................... 361/747; 361/727

(58) Field of Classification Search ................. 361/747, 361/727, 683, 685, 724, 730, 741, 756, 798, 361/726, 740; 312/332.1, 333, 223.2, 348.6
See application file for complete search history.

(56) References Cited

U.S. PATENT DOCUMENTS

| | | | |
|---|---|---|---|
| 4,002,386 A | 1/1977 | McKenzie | |
| 4,979,909 A | 12/1990 | Andrews | |
| 5,003,431 A | 3/1991 | Imsdahl | |
| 5,262,923 A | 11/1993 | Batta et al. | |
| 5,563,767 A * | 10/1996 | Chen | 361/679.31 |
| 5,791,753 A * | 8/1998 | Paquin | 312/332.1 |
| 5,978,212 A * | 11/1999 | Boulay et al. | 361/679.31 |
| 5,997,115 A | 12/1999 | Radloff et al. | |
| 6,208,514 B1 | 3/2001 | Stark et al. | |
| 6,236,573 B1 | 5/2001 | Gundlach et al. | |
| 6,373,695 B1 | 4/2002 | Cheng | |
| 6,377,447 B1 | 4/2002 | Boe | |
| 6,407,913 B1 * | 6/2002 | Peachey et al. | 361/679.57 |
| 6,421,236 B1 * | 7/2002 | Montoya et al. | 361/679.58 |
| 6,456,489 B1 | 9/2002 | Davis et al. | |
| 6,469,889 B1 | 10/2002 | Gan | |
| 6,654,240 B1 | 11/2003 | Tseng et al. | |
| 6,665,908 B1 | 12/2003 | Mease | |
| 7,347,514 B2 * | 3/2008 | Laret et al. | 312/332.1 |
| 7,511,953 B2 * | 3/2009 | Tao et al. | 361/726 |

* cited by examiner

*Primary Examiner*—Jinhee J Lee
*Assistant Examiner*—Yuriy Semenenko
(74) *Attorney, Agent, or Firm*—Cynthia G. Seal; Jeffrey L. Streets

(57) ABSTRACT

A modular electronic system including a mechanism for releasably securing a modular device within a chassis, and for facilitating insertion and removal of the modular device. One embodiment provides a modular device that includes a handle secured to opposing pivotable lever arms. A follower pin secured to one end of the lever arms rides in a slot defined by the chassis. The slot is arranged so that pulling upward on the handle moves the follower pin in one direction along the slot to urge the modular device in a direction further into the device bay, and pushing downward on the handle urges the modular device in a direction out of the device bay, thereby providing a mechanical advantage to the user. When the modular device is fully inserted, retractable locking members provided on the modular device move into windows provided on the chassis, to releasably lock the modular device in the device bay. A module release mechanism includes a release plate that moves into engagement with a sloped or ramped surface of the locking members in response to squeezing the handle. Engagement of the release plate with the ramped surface moves the locking members inward and out of the windows on the chassis, to unlock the modular device from the device bay.

18 Claims, 6 Drawing Sheets

MECHANICALLY-ASSISTED INSERTION AND REMOVAL OF MODULAR DEVICE

BACKGROUND OF THE INVENTION

1. Field of the Invention

The present invention relates to modular electronic systems. More particularly, the invention relates to a modular device and mechanisms for facilitating the insertion and removal of the modular device from a device bay.

2. Description of the Related Art

Electronic systems such as computer systems often have a modular construction wherein one or more modular devices can be removably installed within a chassis. In a rack-mountable server system, for example, modular hardware devices such as blade servers and support modules are interconnected within a shared system chassis. Rack-mountable server chassis typically have a plurality of server bays for removably receiving the servers, and a plurality of other device bays for removably receiving the shared support modules. This type of chassis also usually includes a circuit board panel, such as a midplane or backplane, having a plurality of connectors to which the modular components are connected when installed in the chassis. The circuit board panel allows electronic communication, including the conveyance of digital and/or analog signal information and power between the modular components along electrical pathways. For example, power may be supplied along a midplane from the power supply module on one side of the midplane to the servers on an opposing side of the midplane, and signal information may be communicated along the midplane between the management module and the servers.

A modular hardware device such as a blade server or support module almost invariably includes a first connector that mates with a second connector in the associated device bay, i.e. the device bay that receives the modular hardware device. Countless different connectors and connector types are known in the art, many having standardized specifications within the industry, and others being proprietary to a particular brand. The modular device is inserted into the associated device bay on the chassis, typically by sliding the device into the device bay. While cabling may still be required to interconnect some types of components, modular devices will typically include rigid connectors that mechanically and electronically mate with other rigid connectors on the chassis upon insertion of the modular device into the device bay.

Considerable force may be required to insert the device into the device bay or remove the device from the device bay, particularly due to the forces required to connect or disconnect the mating connectors. Therefore, solutions are desired for facilitating insertion and/or removal of modular devices within a chassis. It would be desirable, for example, to reduce the user-supplied force required to insert and remove a modular device from a device bay, and to provide improved ergonomics and more natural arm and hand movements during removal and insertion. It would also be desirable to provide an improved mechanism for securing the device in a device bay to prevent the device from being inadvertently disconnected from the computer system.

SUMMARY OF THE INVENTION

One embodiment provides a modular electronic system that includes a chassis having a device bay and a modular device configured for insertion in the device bay. The device bay includes a first connector, and the modular device has a second connector for mating with the first connector upon insertion of the modular device into the device bay. The modular device is guided by the device bay to substantially align the first connector with the second connector. One or more retractable locking members on the modular device are biased into respective windows on the chassis wall upon insertion of the device into the device bay, to releasably lock the modular device within the device bay. A module release mechanism includes a release plate slidably positioned between the modular device and the chassis wall and an actuator coupled to the release plate. The actuator is operable by hand to selectively unlock the modular device from the device bay by moving the release plate into engagement with the locking members to retract the locking members from the respective windows.

Another embodiment provides a modular electronic system that includes a modular device and a chassis having a device bay configured for removably receiving the modular device. The device bay includes a first connector for mating with a second connector on the modular device upon insertion of the modular device into the device bay. The device bay constrains the modular device to substantially align the first connector with the second connector. A lever arm is pivotally coupled to the device module about a lever arm pivot axis. A handle is secured to the lever arm and is spaced from the pivot axis. A follower pin is secured to the lever arm and is spaced from the pivot axis in a direction away from the handle. A guide provided on the chassis receives the follower pin, such that the follower pin rides along the guide as the lever arm is pivoted about the pivot axis, to assist moving the modular device within the device bay.

Other embodiments, aspects, and advantages of the invention will be apparent from the following description and the appended claims.

DETAILED DESCRIPTION OF SELECTED EMBODIMENTS

Figure 1:
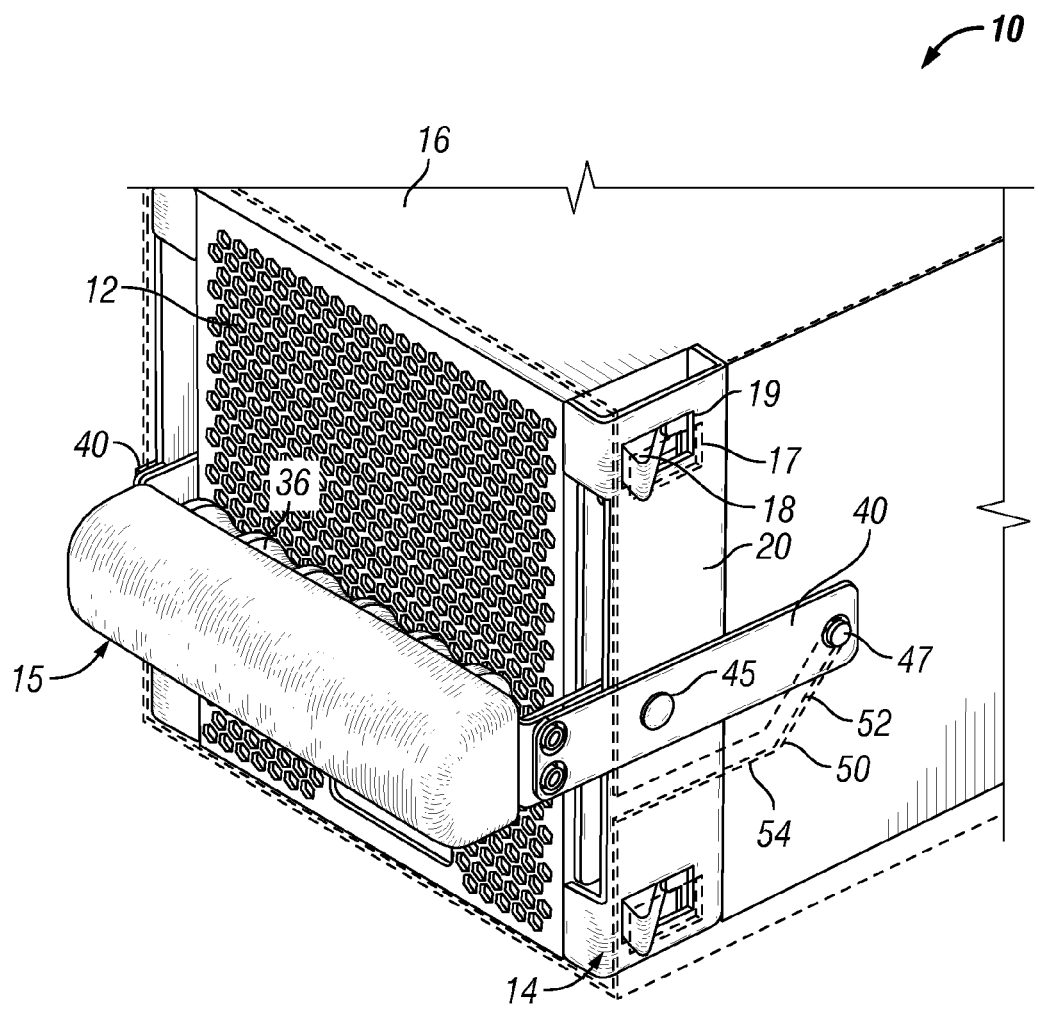
FIG. 1 is a perspective view of a modular device fully inserted into the device bay of a chassis.

The present invention provides a modular computer system with a mechanism for releasably securing a modular device within a device bay and for mechanically assisting the insertion and removal of the modular device from the device bay. The invention has many applications in the realm of modular computer system design. For example, the invention may be applied to the assembly of individual PCs or servers, such as to provide modular components for an individual PC or server, and to facilitate the insertion and removal of such modular components. The invention also has utility in the modular construction of more expansive server systems, such as rack mountable server systems. For example, the servers and support modules that make up a typical rack mountable server system may be imparted with a modular construction according to the invention. This modular construction allows the servers and support modules to be installed in designated bays of a system chassis, and further facilitates the insertion, securing, and subsequent removal of such modular devices with respect to the system chassis. The invention will be largely discussed below and with reference to the accompanying figures in the context of a modular server component, such as a power supply. However, one of ordinary skill in the art having the benefit of this disclosure will appreciate numerous other applications for modular system construction in accordance with the invention.

In one embodiment, a modular device, such as a modular power supply, includes a handle secured to opposing lever arms that are pivotally secured to the modular device. A follower pin secured to one end of the lever arms rides in a slot defined by the chassis. The slot is one of several alternative forms of a guide that may be selected according to the invention. The slot is arranged so that pivoting the lever arms in one rotational direction (e.g. by pulling upward on the handle) moves the follower pin in one direction along the slot to urge the modular device in a direction out of the device bay, and pivoting the lever arms in the opposite rotational direction (e.g. by pushing downward on the handle) urges the modular device in a direction into the device bay. According to one aspect of the invention, therefore, the handle provides a mechanical advantage and ergonomic operation for inserting the modular device, such as by pushing down and forward on the handle, and for removing the modular device, such as by pulling up and back on the handle. These benefits are particularly useful for moving the inserted modular device into a fully inserted position in the device bay, whereupon one or more connectors on the modular device is mated with associated connectors in the device bay. The device bay constrains the modular device to substantially align the mating connectors prior to mating.

According to another aspect of the invention, the modular device may be releasably locked within the device bay. When the modular device is fully inserted, retractable locking members provided on the modular device are aligned with and move into windows provided on the chassis, to releasably lock the modular device in the device bay. A module release mechanism is therefore provided for unlocking the modular device. The module release mechanism includes a release plate slidably positioned between the modular device and the chassis wall and also includes an actuator coupled to the release plate. The actuator includes a pair of opposing actuator arms that are pivotally secured to the release plate. The handle includes a grip member that is secured to the actuator arms and is generally parallel with and movable with respect to the body of the handle. Thus, squeezing the handle moves the grip member toward the handle body, which moves the release plate into engagement with a sloped or ramped surface of the locking members. Engagement of the release plate with the ramped surface moves the locking members inward and out of the windows on the chassis, to unlock the modular device from the device bay. This movement of the grip member toward the handle body also substantially aligns a pivot of the actuator arms with a pivot of the lever arms. Thus, when the handle is raised or lowered, as the case may be, the lever arms and actuator arms pivot about a common pivot axis, so that the handle may be raised or lowered without impediment by the module release mechanism.

FIG. 1 is a perspective view of a modular computer system 10 according to the invention, with a modular device 12 fully inserted into the device bay 14 of a chassis 16 (shown here as a transparent chassis to better illustrate the modular device). For example, the modular device 12 may be a power supply, and the chassis 16 may be the chassis of a server or PC. As another example, the modular device 12 may be one of a plurality of support modules included with a rack-mountable server system, and the chassis 16 may be the chassis of the rack-mountable server system. The modular device 12 includes a handle 15 secured to a pair of opposing lever arms 40, each lever arm being secured to one end of the handle. Each lever arm 40 is also pivotally secured about a pivot connection 45 to one of an opposing pair of pivot support plates 20 on the chassis 16. A follower pin 47 is secured to each lever arm 40 and rides in a slot-type guide 50 (alternatively referred to herein as the "slot" 50) on the chassis 16 for guiding the follower pin. The slot 50 defines a guide having a profile for guiding the follower pin 47 as the lever arm 40 is pivoted about the pivot member 45. The slot 50 is just one of many types of a guide that may be selected according to the invention to guide the follower pin. Alternative guides that may provide a profile for guiding the follower pin 47 or its equivalent include, by way of example, a track or a ledge (not shown) formed on the chassis 16.

The handle 15 may be pushed or pulled by hand in a direction straight into or out of the device bay 14 for moving the modular device 12 into or out of the device bay 14. The handle 15 may also be raised or lowered about the pivot connection 45 to assist with moving the modular device 12 into or out of the device bay 14. In particular, raising the handle 15 pivots the lever arm 40 about the pivot connection 45. Assuming that the modular device was previously fully installed as shown in FIG. 1, this pivoting of the lever arm 40 causes the follower pin 47 to travel downward along an inclined portion 52 of the guide profile 50, which produces a force component on the lever arm 40 that urges the modular device 12 in a direction out of the device bay 14, to assist with removing the modular device 12 from the device bay. Conversely, pushing down on the handle 15 when the modular device 12 has been inserted into the device bay 14 to the point where the follower pin has entered an inclined portion 52 of the slot 50 causes the follower pin 47 to travel upward along the inclined portion 52, which produces a force component on the lever arm 40 that urges the modular device 12 in a direction further into the device bay 14.

It should be noted that inclined portion of the slot has a length and angle that are primarily intended to provide a mechanical advantage when raising or lowering the handle to assist with coupling and decoupling of the connectors, which typically occurs near the full extent of insertion. Thus, the angle and length of the inclined portion 52 are two parameters of the modular computer system 10 that may be selected to control the magnitude of the mechanical advantage provided by raising or lowering the handle 15, or the extent of displacement of the modular device 12 with respect to the chassis 16 in response to raising or lowering of the handle 15. For example, a steeper angle of inclination of the inclined portion 52 may provide a greater mechanical advantage, and a longer inclined portion 52 may provide greater displacement of the modular device 12 when the handle is raised or lowered. Another parameter that may be selected to control the magnitude of the mechanical advantage provided by raising or lowering the handle 15 is the length of the handle. For example, increasing the distance between the handle body 11 and the pivot member 45 of the lever arm 40 will also generally increase the magnitude of the mechanical advantage.

Retractable locking members 18 are provided on the modular device 12. Windows 17 on opposing sides of the chassis 16 are formed at the same or similar elevation as the windows 19 on the pivot support plates 20 so that the device windows 19 are vertically and horizontally aligned with the chassis windows 17 when the modular device 12 is fully inserted as shown. The window 19 on the pivot support plate 20 is provided to allow the locking member 18 to reach the outer window 17 on the chassis 16. Each window 19 receives a respective one of the retractable locking members 18, and each window 17 receives one of the retractable locking members 18 when the modular device 12 is fully inserted in the device bay 14. The locking members 18 are biased outwardly, such as by being spring loaded. When the modular device 12 is fully inserted into the device bay 14 and the handle 15 is released, the outwardly-biased locking members 18 align with the windows 17 and move into the position shown, projecting outwardly into the windows 17 of the chassis 16. If the grip member 36 is sufficiently biased away from the handle body 11 (e.g. by a spring), the locking members 18 may "snap" into the windows 17, i.e. move outwardly into the windows 17 with considerable force. By moving into the windows 17, the retractable locking members 18 releasably secure (i.e. "lock") the modular device 12 in the device bay 14, so that the modular device 12 cannot be readily removed without first retracting the locking members 18. Thus, before the modular device 12 may be removed from the device bay 14, the modular device must be "unlocked" from the chassis 16 by retracting the locking members 18. As explained further below, squeezing the handle 15 retracts the locking members 18. The handle 15 may then be lifted upward, as previously noted, to help remove the modular device 12 from the device bay 14. These features and operations are further discussed below and illustrated in the remaining figures.

Figure 2:
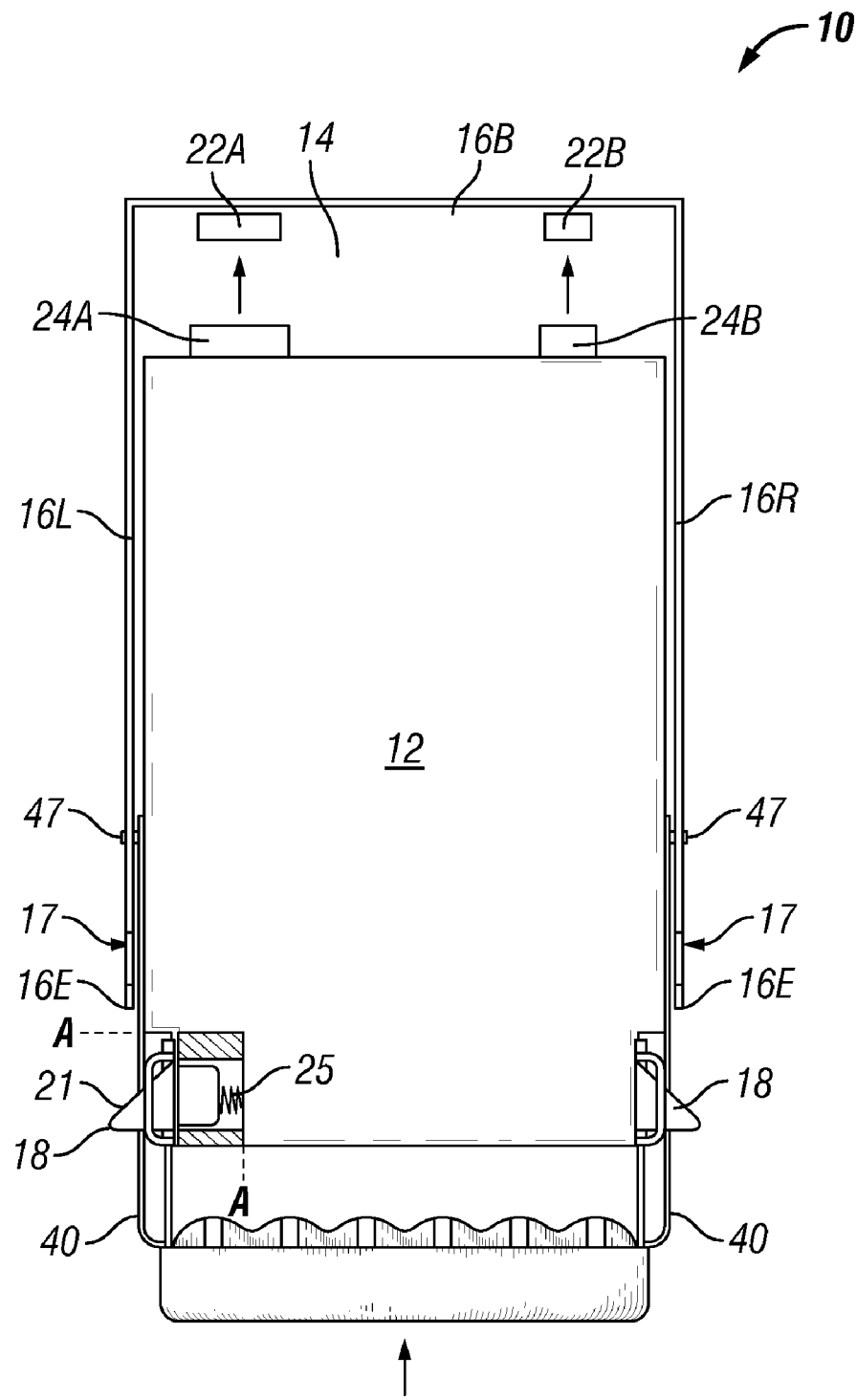
FIG. 2 is a partially sectioned, schematic top view of the modular device and device bay.

FIG. 2 is a schematic top view of the modular computer system 10. The chassis 16 includes a left sidewall 16L and a right sidewall 16R that together laterally and rotationally constrain the modular device 12. In the orientation shown, these lateral and rotational constraints limit the modular device 12 to horizontal translation straight into or out of the device bay 14. A back panel 16B of the chassis 16 limits how far the modular device 12 may be moved into the device bay 14. The back panel 16B may be a portion of a midplane or backplane, and supports two electronic connectors 22A and 22B that may be in communication with other computer system devices via the midplane or backplane. While two exemplary connectors 22A, 22B are shown in the device bay 14 of this embodiment, any number of connectors might be included in a device bay, depending on the type of modular device to be inserted and the number and type of connectors included with the modular device. The modular device 12 here includes two electronic connectors 24A, 24B, for mating with the connectors 22A, 22B, respectively, when the modular device 12 is fully inserted into the device bay 14. The lateral and rotational constraints provided by the sidewalls 16L and 16R (as well as the top and bottom walls of the bay) guide the modular device 12 so that the connectors 24A, 24B are substantially aligned with the connectors 22A, 22B as the modular device 12 is inserted into the device bay 14. As the modular device 12 is moved further into the device bay 14, the connector 24A mates with the connector 22A and the connector 24B mates with the connector 22B. The modular device 12 comes to rest once it is fully inserted into the device bay 14, as in FIG. 1.

A portion of the schematic top view of FIG. 2 is partially sectioned along section line A-A in FIG. 2 to reveal further details of one of the retractable locking members 18. The retractable locking member 18 has a ramped surface 21. When the modular device 12 is inserted into the device bay 14, an edge 16E of the chassis 16 engages the ramped surface 21, urging the locking member 18 inward against an outwardly-biasing spring 25 until the locking member 18 clears the sidewall 16L, so that the modular device 12 may be moved further into the device bay 14. When the modular device 12 reaches full insertion, the locking members 18 are aligned with the windows 17 in the chassis 16. The locking members 18 move outwardly through the windows 17 to releasably secure the modular device 12 within the device bay 14.

Figure 3:
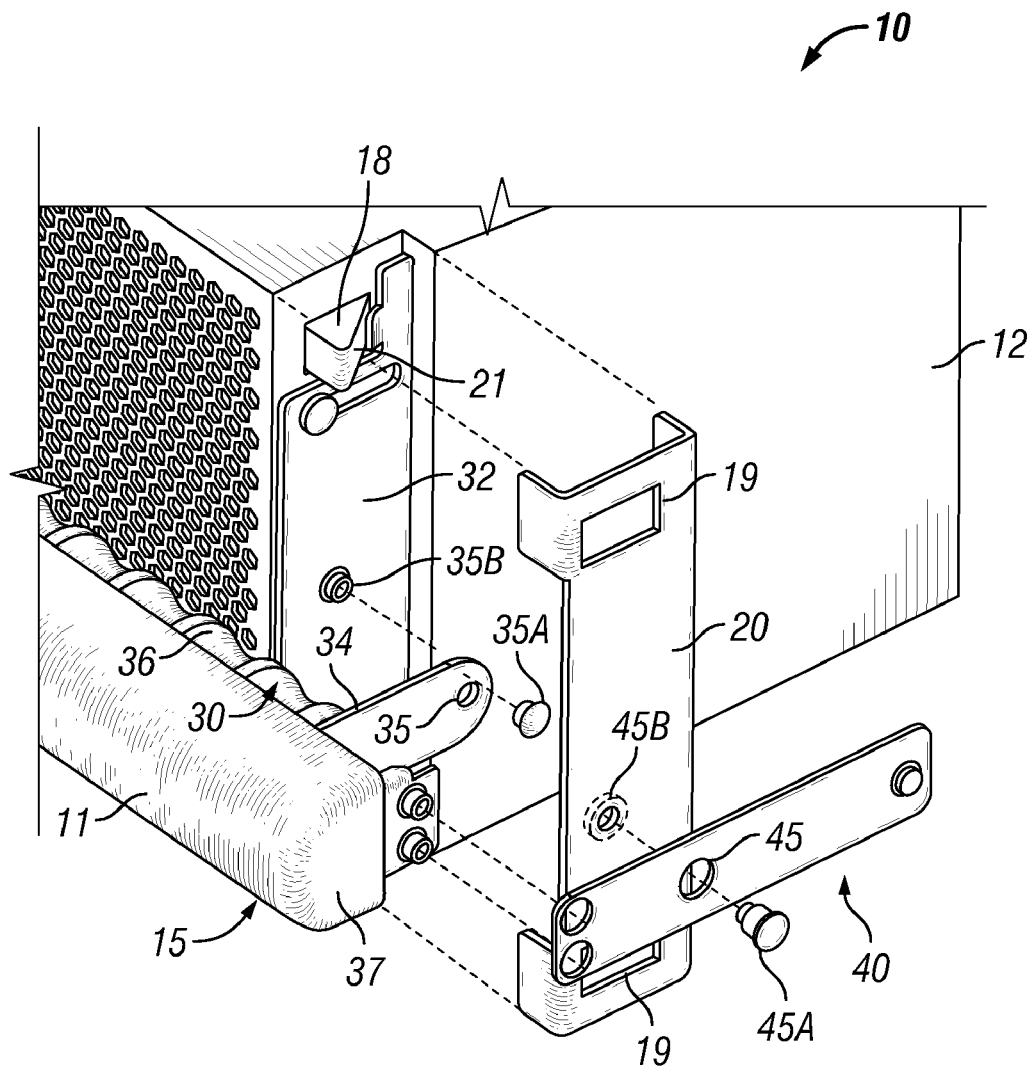
FIG. 3 is an exploded perspective view of the modular device.

FIG. 3 is an exploded perspective view of the modular device 12 revealing some of the internal parts that help manipulate the modular device 12 within the chassis 16 (see FIG. 2 for reference to details of the chassis 16). A module release mechanism generally indicated at 30 is provided for unlocking the modular device 12 from the chassis 16. The module release mechanism includes a release plate 32 slidably secured to one side of the modular device 12 between the modular device 12 and the right sidewall 16R of the chassis 16 (see FIG. 1). A similar release plate (not shown) is slidably secured to the other side of the modular device 12, between the left side of the modular device 12 and the left sidewall 16L. The module release mechanism 30 further includes an actuator arm 34 pivotally coupled to the release plate 32 about a pivot connection 35, using what is conceptually shown in this embodiment as a pin 35A and a pin hole 35B for receiving the pin 35A. Likewise, the pivot connection 45 that couples the lever arm 40 to the pivot support plate 20 of the modular device 12 includes what is conceptually shown as a pin 45A and a pin hole 45B for receiving the pin 45A. Any of a variety of pivot mechanisms known in the art may be substituted for the pivots 35, 45, including but not limited to rivets, screws, threads, bolts, nuts, washers, and combinations thereof.

The handle 15 includes a handle body 11 and a movable grip member 36 generally parallel with and partially received by the handle body 11. The grip member 36 is secured to the actuator arms 34, and may be biased away from the handle body 11, such as with a spring (not shown) between the handle body 11 and the grip member 36. The grip member 36 is positioned sufficiently close to the handle body 11 that the grip member 36 and handle may be partially encircled by the user's hand, such as by placing the base of the thumb against the handle body 11 and grabbing the grip member 36 with the remaining fingers of the same hand. Thus, the grip member 36 may be moved by hand toward and further into the handle body 11 by squeezing together the grip member 36 and handle body 11. In response to moving the grip member 36 toward the handle body 11, the grip member 36 pulls the release plate 32 toward the handle. As a result, the release plate 32 engages the ramped surface 21, which is angled with respect to the direction of movement of the release plate 32. As the release plate 32 engages the ramped surface 21, the release plate 32 urges the locking member 18 inward, out of the window 17 in the chassis 16, to unlock the modular device 12 from the chassis 16. The locking members 18 may or may not still project through the windows 19 on the pivot support plate 18 even after the modular device 12 is unlocked from the chassis 16.

Figure 4:
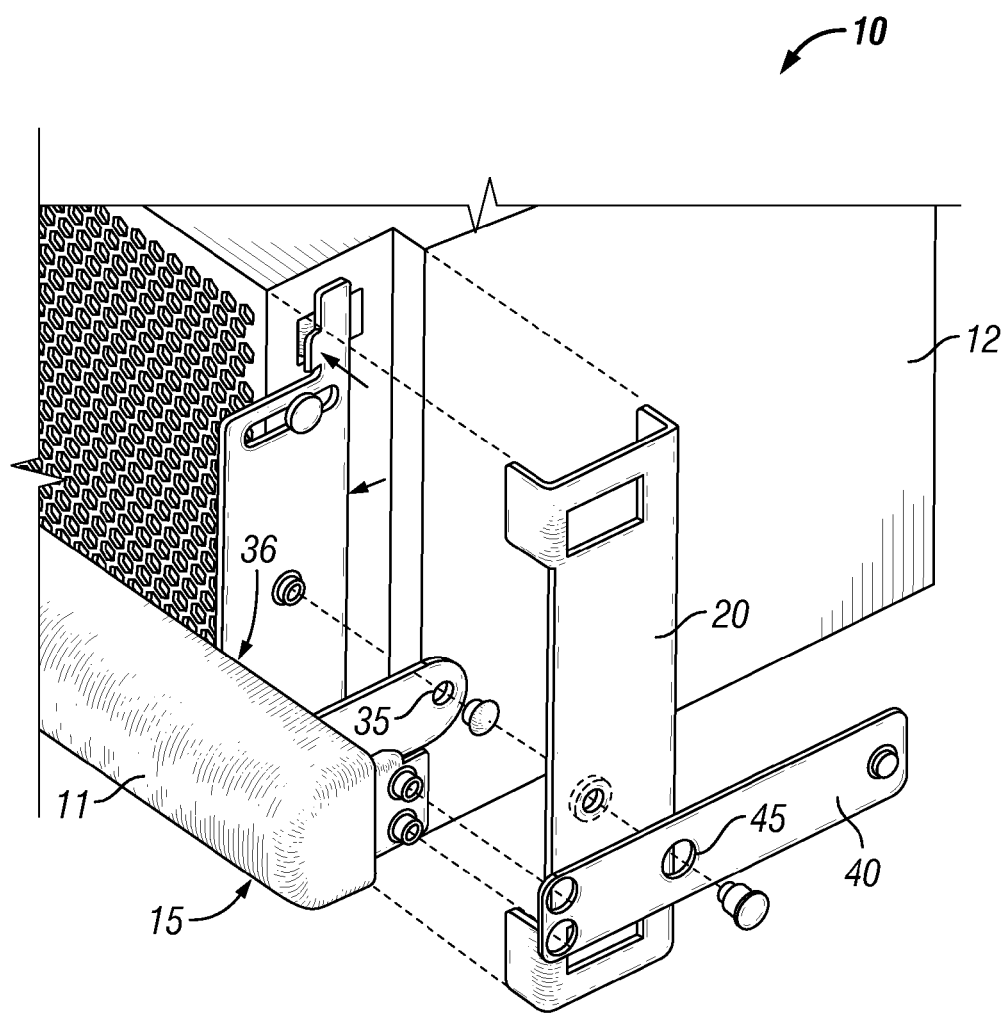
FIG. 4 is an exploded perspective view of the modular device with the grip member moved toward the handle body to unlock the modular device.

FIG. 4 is an exploded perspective view of the modular device 12 with the grip member 36 (now hidden) moved toward the handle body 11, as it would be when the handle 15 is squeezed to unlock the modular device 12. By design, movement of the grip member 36 to this position also axially aligns the pivot connection 35 with the pivot connection 45. This allows the lever arms 40 and actuator arms 34 to pivot around a common axis of rotation defined by the pivots 35, 45 when the handle 15 is subsequently raised to remove the modular device 12 from the device bay 14.

Figure 5:
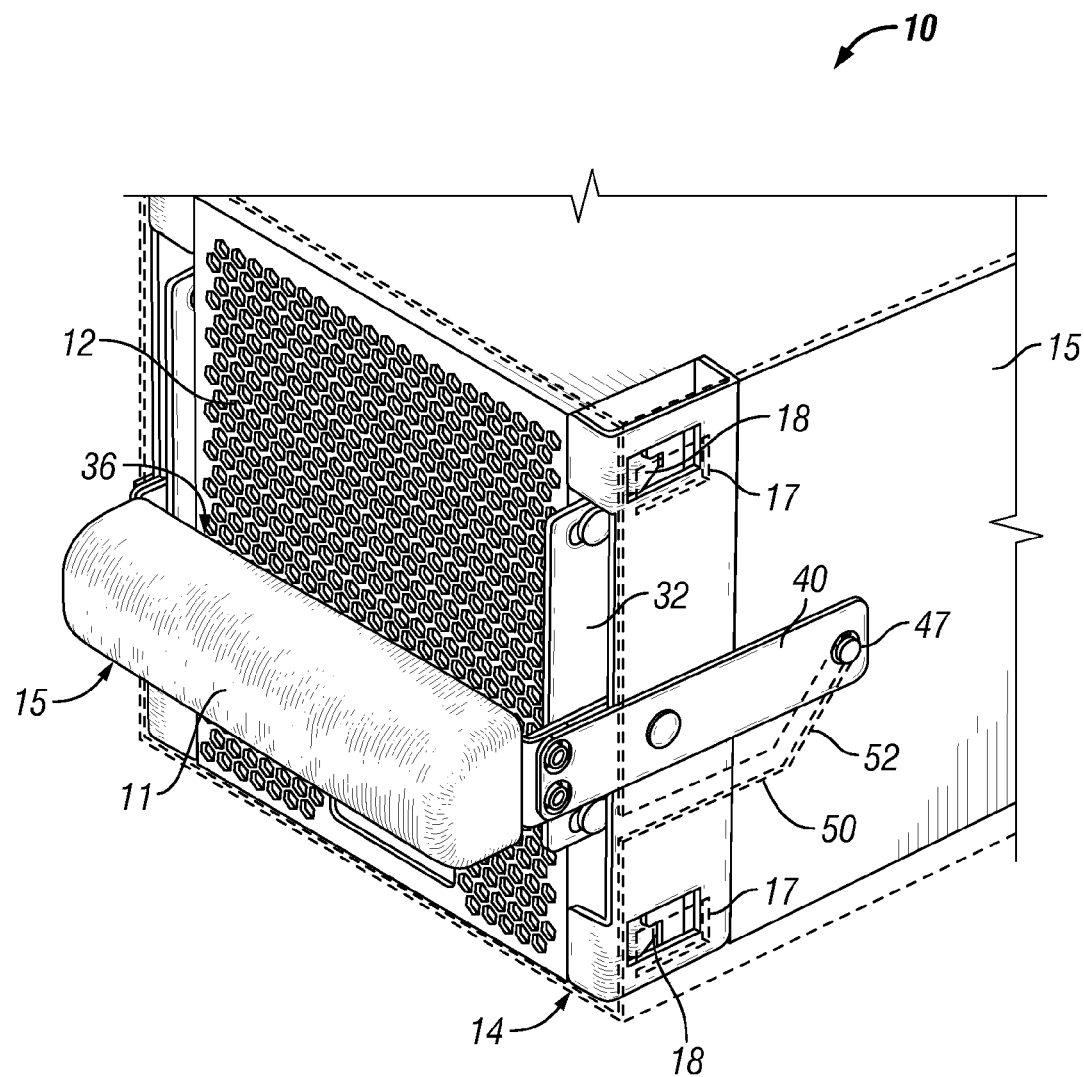
FIG. 5 is an assembled perspective view of the modular device with the grip member moved toward and fully recessed within the handle body.

FIG. 5 is an assembled perspective view of the modular device 12 with the grip member 36 (still hidden) moved toward and fully recessed within the handle body 11, as it would be when the handle 15 is squeezed to unlock the modular device 12. The release plate 32 is shown moved forward as compared to its previous position in FIG. 1. However, the modular device 12 is still fully inserted into the device bay 14 in FIG. 5, with the follower pin 47 at the uppermost end of the inclined portion 52 of the slot 50. For reasons described above, the modular device 12 is now unlocked from the chassis 16, and the handle 15 may now be lifted upward to assist with removing the modular device 12 from the device bay 14. Lifting up on the handle 15 will therefore pivot the lever arms 40 about the pivot connection 45, causing the follower pin 47 to move down the inclined portion 52 of the slot 50, to assist in removing the modular device 12 from the device bay 14. As the handle 15 is raised to pivot the lever arms 40 about the pivot axis 45, the actuator arms 34 (see FIG. 4) will likewise pivot about their pivot connections 35, which have been aligned with the pivot connections 45 as a result of squeezing the handle 15.

Figure 6:
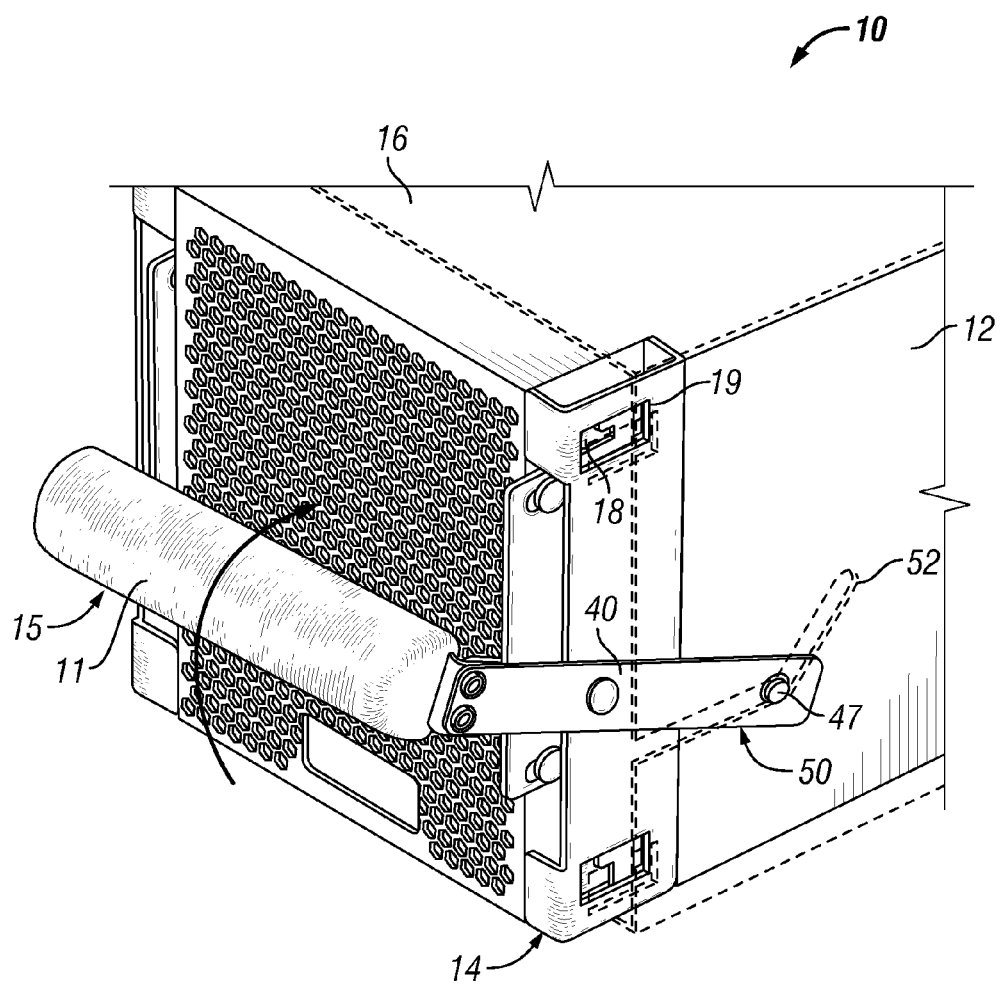
FIG. 6 is an assembled perspective view of the modular device with the grip member moved toward and fully recessed within the handle body and with the handle raised with respect to its previous position in FIG. 5.

FIG. 6 is an assembled perspective view of the modular device 12 with the grip member 36 (hidden) still moved toward and fully recessed within the handle body 11 as it was in FIG. 5, and with the handle 15 raised with respect to its previous position in FIG. 5. As a result of raising the handle, the follower pin 47 has moved down the inclined portion 52 of the guide profile 50, thus moving the modular device 12 partially out of the device bay 14. This movement of the modular device 12 is sufficient to separate the connectors 24A, 24B from the connectors 22A, 22B (see FIG. 2). With the connectors thus separated, the modular device 12 may now be fully removed within the device bay 14 with significantly less force than the force required to separate the connectors. Thus, the user may simply pull on the handle 15 to completely remove the modular device 12 from the device bay 14 of the chassis 16. Once removed, the user may conveniently carry the modular device 12 holding the handle 15, such as to move the modular device 12 to a worktable for service.

To summarize, FIGS. 1, 5, and 6 illustrate a sequence for removing the modular device 12 from the device bay 14. In FIG. 1, the modular device 12 is shown fully inserted in the device bay 14, and the locking members 18 project into the windows 17 to lock the modular device 12 to the chassis 16. To unlock the modular device 12, the handle 15 is squeezed to move the grip member 36 toward and further into the handle body 11, to retract locking members 18, as shown in FIG. 5. Then, the handle 15 is raised to urge the modular device 12 in a direction out of the device bay 14 sufficient to separate the connectors on the modular device 12 from the connectors in the device bay 14, as shown in FIG. 6. The modular device 12 can now be pulled the rest of the way out of the device bay 14 by pulling on the handle 15.

The above sequence may be generally reversed to insert and lock the modular device 12 in the device bay 14. First, the user preferably squeezes the handle 15 to move the grip member 36 toward and/or into the handle body 11, thus aligning the pivots 35 and 45 (see FIG. 4). While still squeezing the handle 15, the modular device 12 may be pushed by hand into the device bay 14 until the follower pin 47 reaches the inclined portion 52 of the slot 50, as illustrated in FIG. 6. The user may confirm that the follower pin 47 has reached the inclined portion 52 by visually observing the follower pin 47. Even if the user does not (or is unable to) visually observe the position of the follower pin 47 relative to the slot 50, the increased resistance to further movement will provide confirmation to the user that the follower pin 47 has reached the base of the inclined portion 52. This visual or tactile confirmation indicates to the user that the handle 15 may now be lowered to further move the modular device 12 into the device bay 14. While preferably still squeezing the handle 15, the user may now push down on the handle 15. Pushing down on the handle 15 will cause the follower pin 47 to move up the inclined portion 52 of the slot 50. This movement of the follower pin 47 will generate a force component on the lever arm 40 that urges the modular device 12 further into the device bay 14. The user may assist this force component by pushing not only downward but forward on the handle 15 in the direction of this force component. The modular device 12 is thereby fully inserted into the device bay 14, as shown in FIG. 5. Then, the user may then lock the modular device 12 in this position in the device bay 14 by releasing the handle 15. Releasing the handle 15 allows the grip member 36 to move away from the handle body 11. Moving the grip member 36 away from the handle body 11 allows the locking members 18 to move outward into the windows 17 on the chassis 16, as shown in FIG. 1, thereby locking the modular device 12.

Thus, using the handle 15 to pivot the lever arms 40 provides a mechanical advantage to the user when inserting the modular device 12 into the device bay 14 or when removing the modular device 12 from the device bay 14. A modular computer system according to the invention may not only reduce the force required to insert or remove the modular device, but also redirects some of the user-supplied force vertically, rather than entirely horizontally. Depending on the dimensions of the chassis 17, it will often be easier and more comfortable (and, thereby, more ergonomic) for a user to pull up and back on the handle 15 to remove the modular device 12 or to push down and forward on the handle 15 to insert the modular device 12, rather than to simply pull the handle 15 straight back or push the handle 15 straight forward. For example, where the position of the modular device 12 is at or below waist-height of the user, the user may find it easier to pull up and back or push down and forward on the handle 15. Reducing the horizontal force component required to insert or remove the modular device according to the invention is particularly useful, for example, in slippery environments, such as while servicing modular computer equipment located on the oily floor of a manufacturing environment. The user is less likely to slip and fall because less horizontal force is required to push or pull the modular device 12.

The terms "comprising," "including," and "having," as used in the claims and specification herein, shall be considered as indicating an open group that may include other elements not specified. The terms "a," "an," and the singular forms of words shall be taken to include the plural form of the same words, such that the terms mean that one or more of something is provided. The term "one" or "single" may be used to indicate that one and only one of something is intended. Similarly, other specific integer values, such as "two," may be used when a specific number of things is intended. The terms "preferably," "preferred," "prefer," "optionally," "may," and similar terms are used to indicate that an item, condition or step being referred to is an optional (not required) feature of the invention.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A modular electronic system, comprising:
a chassis having a device bay including a first connector
a modular device configured for insertion in the device bay, the modular device having a second connector for mating with the first connector upon insertion of the modular device into the device bay, wherein the modular device is guided by the device bay to substantially align the first connector with the second connector;
one or more retractable locking members disposed on the modular device and one or more respective windows on a chassis wall, wherein the retractable locking members are biased into the respective windows upon insertion of the device into the device bay to releasably lock the modular device within the device bay; and
a module release mechanism including a release plate slidably positioned between the modular device and the chassis wall and an actuator coupled to the release plate, wherein the actuator is operable by hand to selectively unlock the modular device from the device bay by moving the release plate into engagement with the locking members to retract the locking members from the respective windows.

2. The modular electronic system of claim 1, further comprising:
a lever arm pivotally coupled to the device module about a lever arm pivot axis;
a handle secured to the lever arm and spaced from the pivot axis;
a follower pin secured to the lever arm and spaced from the pivot axis in a direction away from the handle; and
a guide provided on the chassis for receiving the follower pin, such that the follower pin rides along guide as the lever arm is pivoted about the pivot axis, to assist moving the modular device within the device bay.

3. The modular electronic system of claim 2, wherein the actuator of the module release mechanism further comprises an actuator arm pivotally coupled to the release plate about an actuator pivot axis, and wherein movement of the actuator arm to unlock the modular device substantially aligns the actuator arm pivot axis with the lever arm pivot axis.

4. The modular electronic system of claim 3, further comprising:
a grip member generally parallel with a body of the handle and secured to the actuator arm, such that the grip member is movable by hand toward the body of the handle for unlocking the modular device from the device bay.

5. The modular electronic system of claim 4, wherein the body of the handle comprises a cavity for at least partially receiving the grip member.

6. The modular electronic system of claim 1, wherein the one or more locking members comprise an axially moveable pin with an engagement surface angled with respect to a direction of movement of the release plate, such that engaging the release plate with the engagement surface retracts the pins.

7. The modular electronic system of claim 1, wherein the modular device is selected from the group consisting of a modular power supply, a server, and a server support module.

8. The modular electronic system of claim 1, further comprising a panel of connectors that includes the first connector, wherein the first connector is in electronic communication with other connectors on the panel.

9. The modular electronic system of claim 8, wherein the panel comprises a midplane or a backplane.

10. A modular electronic system, comprising:
a modular device and a chassis having a device bay configured for removably receiving the modular device, the device bay including a first connector for mating with a second connector on the modular device upon insertion of the modular device into the device bay, wherein the device bay constrains the modular device to substantially align the first connector with the second connector;
a lever arm pivotally coupled to the device module about a lever arm pivot axis;
a handle secured to the lever arm and spaced from the pivot axis;
a follower pin secured to the lever arm and spaced from the pivot axis in a direction away from the handle; and
a guide provided on the chassis for receiving the follower pin, such that the follower pin rides along the guide as the lever arm is pivoted about the pivot axis, to assist moving the modular device within the device bay.

11. The modular electronic system of claim 10, further comprising:
one or more retractable locking members disposed on the modular device and one or more respective windows on a chassis wall, wherein the retractable locking members are biased into the respective windows upon insertion of the device into the device bay to releasably lock the modular device within the device bay; and
a module release mechanism including a release plate slidably positioned between the modular device and the chassis wall and an actuator coupled to the release plate, wherein the actuator is operable by hand to selectively unlock the modular device from the device bay by moving the release plate into engagement with the locking members to retract the locking members from the respective windows.

12. The modular electronic system of claim 11, wherein the actuator of the module release mechanism further comprises an actuator arm pivotally coupled to the release plate about an actuator pivot axis, and wherein movement of the actuator arm to unlock the modular device substantially aligns the actuator arm pivot axis with the lever arm pivot axis.

13. The modular electronic system of claim 12, further comprising:
a grip member generally parallel with a body of the handle and secured to the actuator arm, such that the grip member is movable by hand toward the body of the handle for unlocking the modular device from the device bay.

14. The modular electronic system of claim 13, wherein the body of the handle comprises a cavity for at least partially receiving the grip member.

15. The modular electronic system of claim 12, wherein the one or more locking members comprise an axially moveable pin with an engagement surface angled with respect to a direction of movement of the release plate, such that engaging the release plate with the engagement surface retracts the pins.

16. The modular electronic system of claim 11, wherein the modular device is selected from the group consisting of a modular power supply, a server, and a server support module.

17. The modular electronic system of claim 10, further comprising a panel of connectors that includes the first connector, wherein the first connector is in electronic communication with other connectors on the panel.

18. The modular electronic system of claim 17, wherein the panel comprises a midplane or a backplane.

* * * * *